United States Patent
Vehoff et al.

(10) Patent No.: US 9,997,731 B2
(45) Date of Patent: Jun. 12, 2018

(54) LIGHT-EMITTING COMPONENT

(71) Applicant: OSRAM OLED GmbH, Regensburg (DE)

(72) Inventors: Thorsten Vehoff, Regensburg (DE); Erwin Lang, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days. days.

(21) Appl. No.: 15/517,147

(22) PCT Filed: Nov. 24, 2015

(86) PCT No.: PCT/EP2015/077544
§ 371 (c)(1),
(2) Date: Apr. 5, 2017

(87) PCT Pub. No.: WO2016/083400
PCT Pub. Date: Jun. 2, 2016

(65) Prior Publication Data
US 2017/0309851 A1     Oct. 26, 2017

(30) Foreign Application Priority Data
Nov. 28, 2014   (DE) .................. 10 2014 117 499

(51) Int. Cl.
*H01L 29/66* (2006.01)
*H01L 51/44* (2006.01)
(Continued)

(52) U.S. Cl.
CPC ........ *H01L 51/442* (2013.01); *H01L 51/5008* (2013.01); *H01L 51/5271* (2013.01); *H01L 51/5036* (2013.01); *H01L 51/5068* (2013.01)

(58) Field of Classification Search
CPC ............... H01L 51/5036; H01L 51/442; H01L 51/5008; H01L 51/5271; H01L 51/5068
See application file for complete search history.

(56) References Cited

U.S. PATENT DOCUMENTS 8,878,225 B2   11/2014  Ingle et al.
2009/0179211 A1*  7/2009  Yoo ......................... H01L 33/20
                                                            257/98
(Continued)

FOREIGN PATENT DOCUMENTS

DE    102010003121 A1    9/2011
EP       2627156 A1    8/2013
(Continued)

*Primary Examiner* — Yosef Gebreyesus
(74) *Attorney, Agent, or Firm* — Slater Matsil, LLP

(57) ABSTRACT

A light emitting component is disclosed. In an embodiment a light-emitting device includes at least one active layer stack configured to generate light, a first electrode electrically contacting the at least one active layer stack, a second electrode electrically contacting the at least one active layer stack and at least one light-emitting face for emitting light. The device further includes a first contact structure electrically conductively connected to the first electrode and a second contact structure electrically conductively connected to the second electrode, wherein the first contact structure laterally surrounds a major part of the at least one light-emitting face and a major part of the second contact structure, and wherein the second contact structure laterally surrounds a major part of the at least one light-emitting face.

22 Claims, 6 Drawing Sheets

(51) Int. Cl.
*H01L 51/52* (2006.01)
*H01L 51/50* (2006.01)

(56) References Cited

U.S. PATENT DOCUMENTS

2010/0176385 A1* 7/2010 Lifka .................. H01L 51/441
257/40
2013/0234127 A1* 9/2013 Sakaguchi .......... H01L 51/5212
257/40

FOREIGN PATENT DOCUMENTS

| WO | 2007036850 | A2 | 4/2007 |
| WO | 2009007899 | A1 | 1/2009 |
| WO | 2010128440 | A1 | 11/2010 |

* cited by examiner

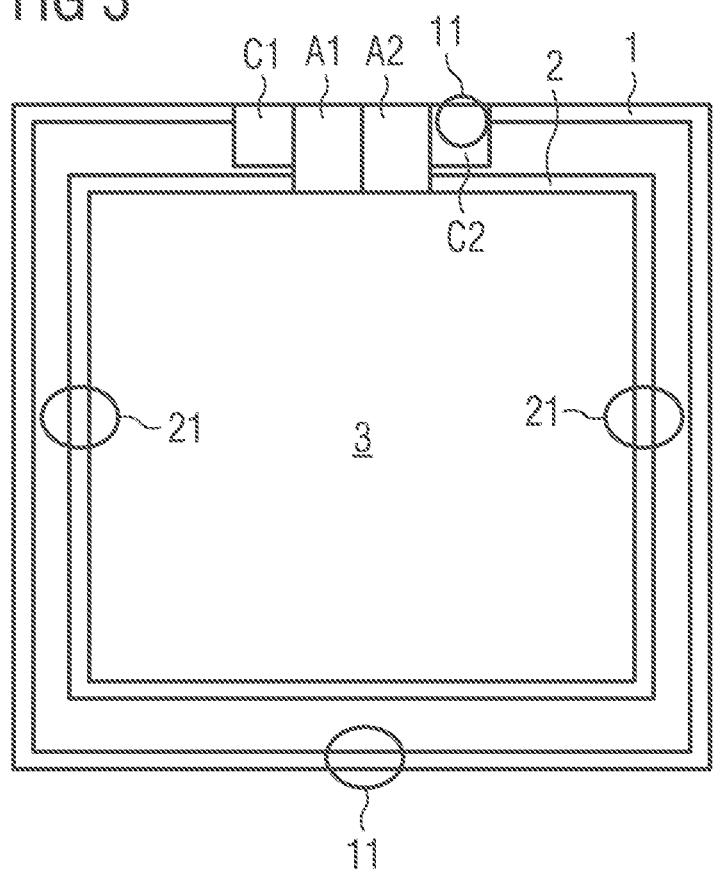

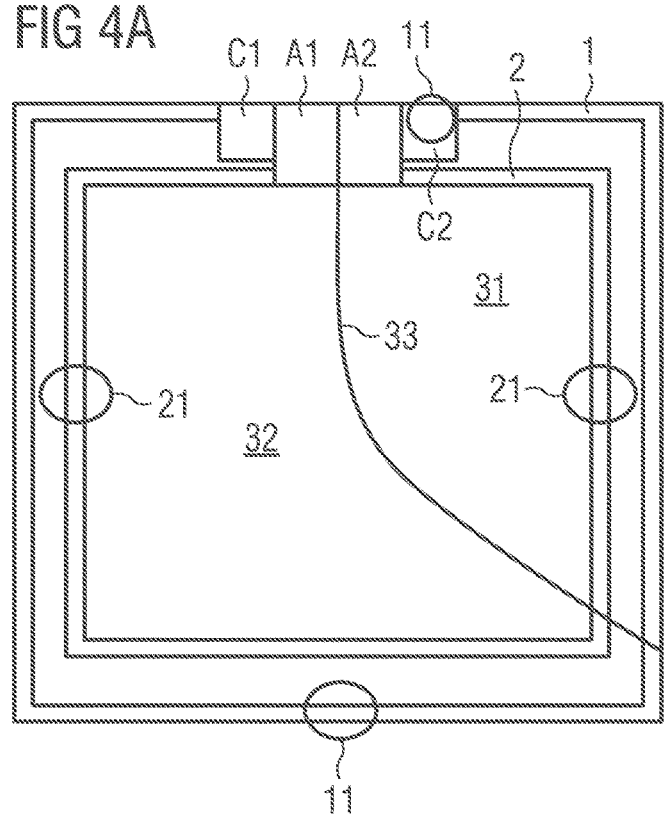
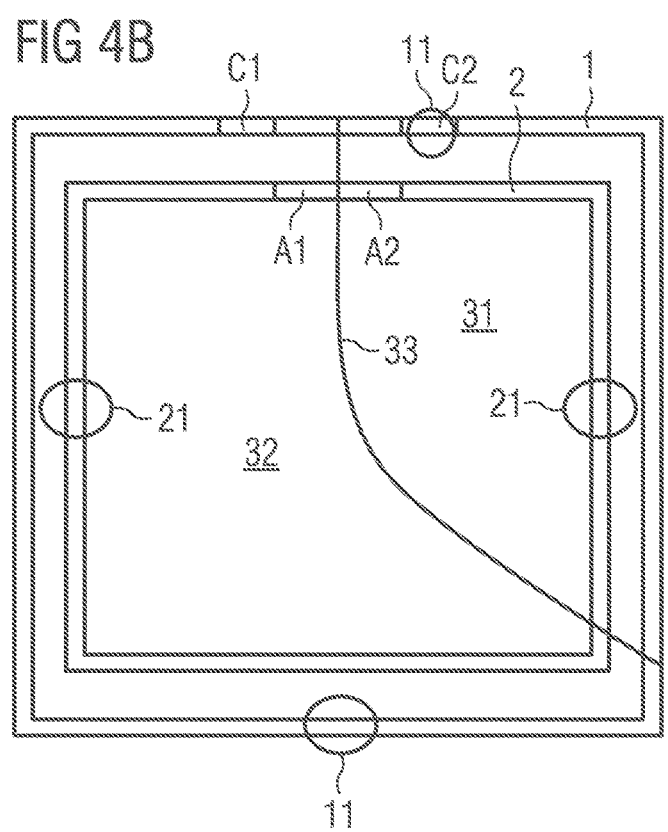

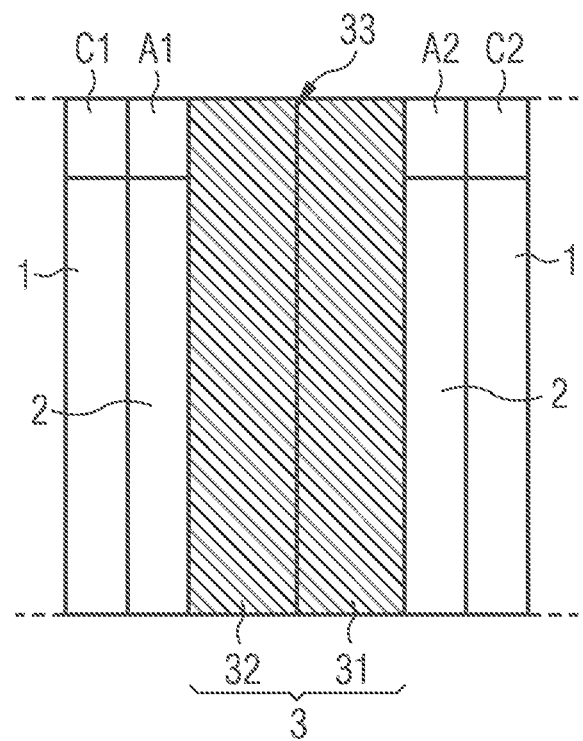
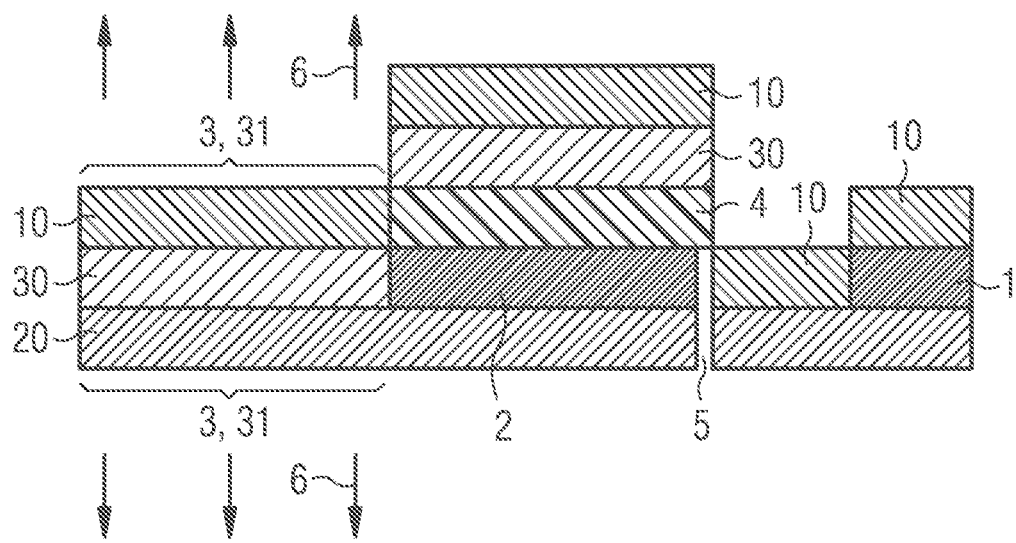

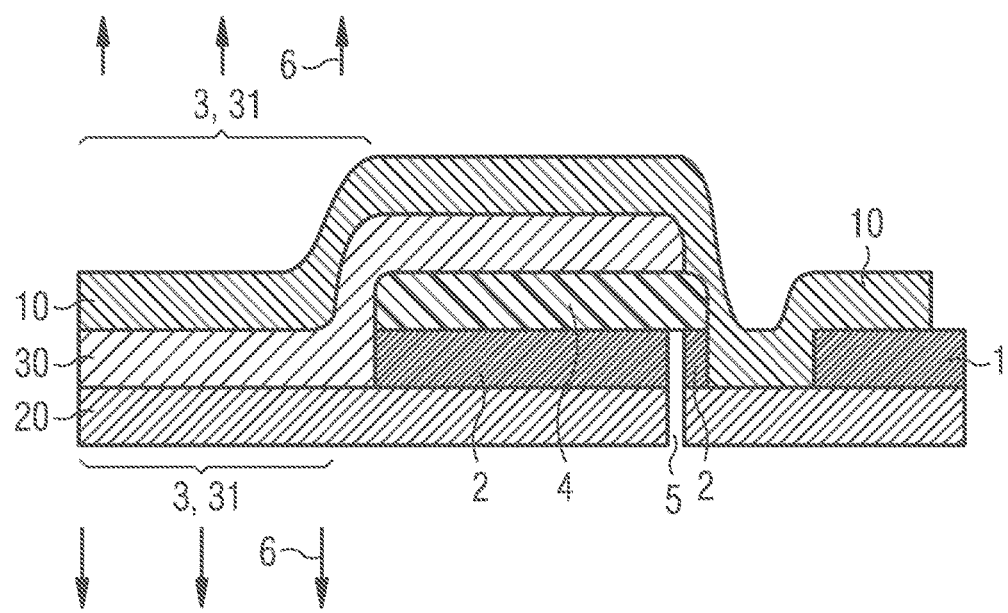

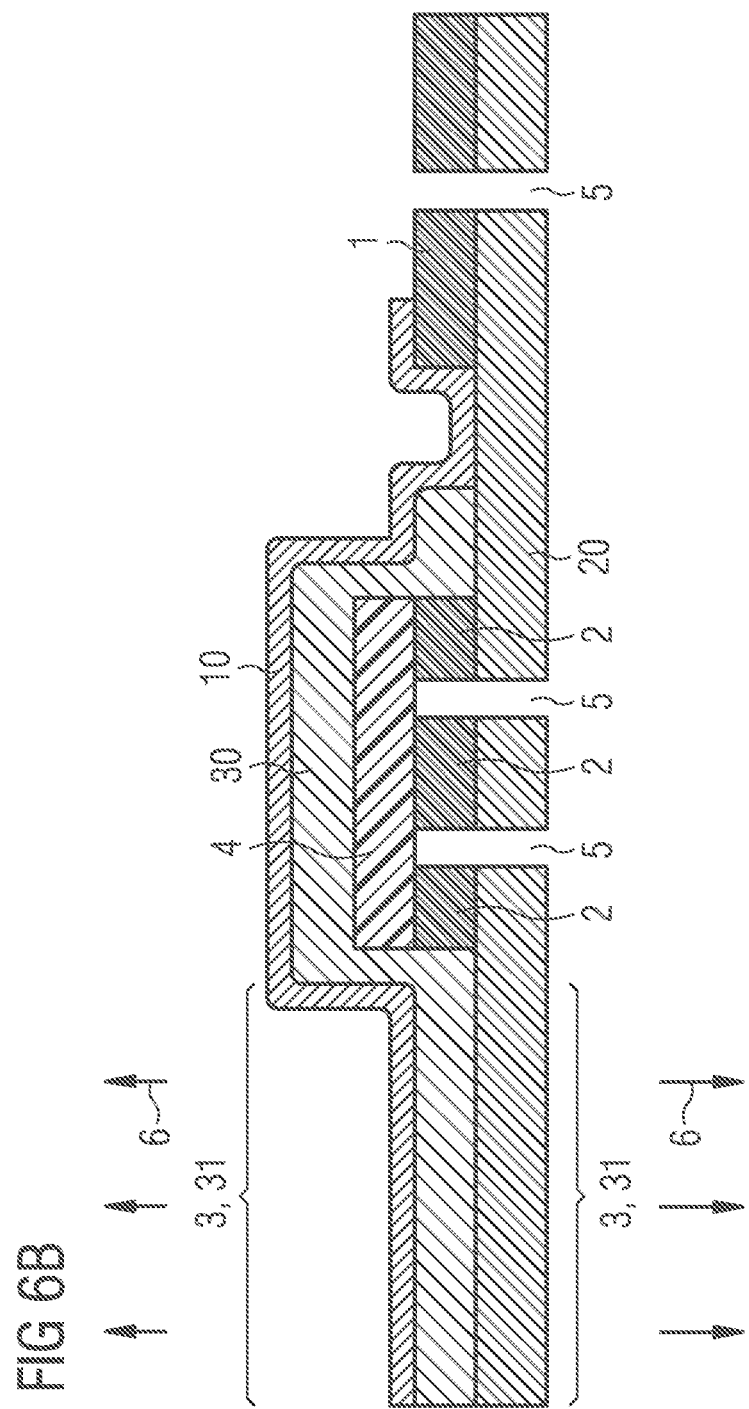

LIGHT-EMITTING COMPONENT

This patent application is a national phase filing under section 371 of PCT/EP2015/077544, filed Nov. 24, 2015, which claims the priority of German patent application 10 2014 117 499.2, filed Nov. 28, 2014, each of which is incorporated herein by reference in its entirety.

TECHNICAL FIELD

A light-emitting device is provided.

SUMMARY OF THE INVENTION

Embodiments provide a light-emitting device which comprises at least one light-emitting face, via which the light is emitted with a particularly homogeneous luminance profile.

According to at least one embodiment of the light-emitting device, the light-emitting device comprises at least one active layer stack which is provided for generating light. In other words, light is generated in at least one active layer stack during operation of the light-emitting device. Colored or white light may here be generated in the active layer stack. The active layer stack, for example, comprises organic layers. The light-emitting device may then in particular be an organic light-emitting diode (OLED).

The light-emitting device may comprise precisely one active layer stack or two or more active layer stacks. If the device comprises two or more active layer stacks, these may be arranged adjacent one another in lateral directions. To this end, the active layer stacks are, for example, applied to a common carrier.

The lateral directions are here and hereinafter those directions which extend parallel to a main plane of extension of the light-emitting device. The light-emitting device extends two-dimensionally in the main plane of extension and, in a vertical direction which extends perpendicularly to the main plane of extension, has a thickness which is small in comparison with the maximum extension of the light-emitting device in the main plane of extension, i.e., along a lateral direction.

According to at least one embodiment of the light-emitting device, the light-emitting device comprises a first electrode which electrically contacts the at least one active layer stack. The first electrode may to this end at least in places be in direct contact with a, for example, organic layer of the active layer stack. During operation of the light-emitting device, current is injected into the active layer stack via the first electrode. The first electrode is, for example, a cathode of the light-emitting device.

According to at least one embodiment of the light-emitting device, the device comprises a second electrode which electrically contacts the at least one active layer stack. The second electrode may to this end be in direct contact with, for example, an organic layer of the active layer stack, wherein the second electrode contacts the active layer stack, for example, from one side and is in particular in direct contact with the active layer stack on this side, which is remote from the side on which the first electrode is arranged. The first and the second electrode may here extend at least in places parallel to the main plane of extension of the light-emitting device.

According to at least one embodiment of the light-emitting device, the light-emitting device comprises at least one light-emitting face which is provided for emitting light. The at least one light-emitting face extends at least in places parallel to the main plane of extension of the light-emitting device. Light generated in the at least one active layer stack is emitted from the light-emitting face. It is here in particular possible for the light to be emitted in two opposing spatial directions, such that the light is emitted from a top of the at least one active layer stack and from a bottom, which is remote from the top, of the at least one active layer stack. In this manner, the light-emitting device emits the light on two sides in two half spaces which are divided from one another by the main plane of extension of the light-emitting device. If the light-emitting device comprises more than one light-emitting face, for example, two light-emitting faces, these are in particular arranged laterally adjacent one another. The light-emitting device may thus overall be an organic light-emitting diode which emits light from the front and the back thereof.

According to at least one embodiment of the light-emitting device, the light-emitting device comprises a first contact structure which is electrically conductively connected to the first electrode. The first contact structure, for example, takes the form of a conductor track which is formed with an electrically conductive material and is in direct contact, for example, with the first electrode. For example, the first contact structure may take the form of metallization which is applied onto the first electrode applied. The first contact structure here does not cover the first electrode completely, but instead only in places, for example, in a peripheral region of the first electrode.

According to at least one embodiment of the light-emitting device, the light-emitting device comprises a second contact structure which is electrically conductively connected to the second electrode. The second contact structure is, for example, in direct contact with the second electrode, wherein the second contact structure in particular does not cover the second electrode completely, but instead only in places. The second contact structure may here take the form of a conductor track which is formed with an electrically conductive material. The second contact structure is, for example, applied as metallization onto the second electrode and covers the second electrode, for example, in a peripheral region.

According to at least one embodiment of the light-emitting device, the first contact structure laterally surrounds a major part of the at least one light-emitting face and a major part of the second contact structure. In other words, the first contact structure may surround the at least one light-emitting face and the second contact structure in lateral directions at least in places in the manner of a frame.

In other words, the first contact structure surrounds more than 50% of the length of a peripheral line which delimits the light-emitting face in the lateral directions. Furthermore, the first contact structure surrounds more than 50% of the second contact structure, i.e., over 50% of the length of the second contact structure is surrounded by the first contact structure. It is here possible for the first contact structure to surround laterally at least 60%, at least 70%, at least 80%, at least 90% or at least 95% of the at least one light-emitting face and/or of the second contact structure. It is furthermore possible for the first contact structure completely laterally to surround the light-emitting face and/or the second contact structure.

According to at least one embodiment of the light-emitting device, the second contact structure laterally surrounds a major part of the at least one light-emitting face. In other words, in the lateral directions the second contact structure is arranged in the manner of a frame around the light-emitting face and surrounds more than 50% of a peripheral line laterally enveloping the at least one light-emitting face. The second contact structure may here surround more than 60%, more than 70%, more than 80%, more than 90% or more than 95% of the light-emitting face. It is additionally possible for the second contact structure laterally completely to surround the at least one light-emitting face.

According to at least one embodiment of the light-emitting device, the light-emitting device comprises at least one active layer stack which is provided for generating light, a first electrode which electrically contacts the at least one active layer stack, a second electrode which electrically contacts the at least one active layer stack, at least one light-emitting face which is provided for emitting light, a first contact structure which is electrically conductively connected to the first electrode, a second contact structure which is electrically conductively connected to the second electrode, wherein the first contact structure laterally surrounds a major part of the at least one light-emitting face and a major part of the second contact structure, and the second contact structure laterally surrounds a major part of the at least one light-emitting face.

According to at least one embodiment of the light-emitting device, the light-emitting device is light-transmitting at least in places in the region of at least one of the at least one light-emitting faces. In particular, it is possible for the light-emitting device to be light-transmitting at each point of the at least one light-emitting face. If the component comprises two or more light-emitting faces, it is possible for the component to be light-transmitting in the region of at least one light-emitting face and to be opaque in the region of at least one light-emitting face. Furthermore, it is possible for the component to be light-transmitting in the region of all the light-emitting faces.

Light-transmitting means here and hereinafter that at least 50%, in particular at least 75%, preferably at least 85% of visible light impinging on a light-transmitting location passes through the light-transmitting element without being absorbed and/or reflected thereby. The light-emitting device may here in particular be clear and transparent. Overall, therefore, the light-emitting device may be a bilaterally emitting transparent OLED.

The light-emitting device described here is based inter alia on the recognition that light-transmitting light-emitting devices, in particular transparent organic light-emitting diodes, have a particularly non-homogeneous luminance profile over their light-emitting face. The luminance profile is non-homogeneous in particular in comparison with unilaterally emitting organic light-emitting diodes which, for example, comprise a reflective first or second electrode.

This may in particular be because in the case of unilaterally emitting, reflective organic light-emitting diodes the reflective electrode has electrical conductivity which may be more than a hundred times greater than the electrical conductivity of the transparent electrode. In the case of a light-transmitting light-emitting device, the electrical conductivity of the first and second electrodes, which are each light-transmitting, for example, is of the same order of magnitude, wherein one of the electrodes is at most once to four times more conductive than the other. This leads, together with uneven heating of the light-emitting device along the light-emitting face, to a particularly non-homogeneous luminance distribution.

It has surprisingly been identified that inter alia the arrangement of a second contact structure, which laterally surrounds a major part of the at least one light-emitting face, and optionally the arrangement of a first contact structure, which laterally surrounds a major part of the at least one light-emitting face and/or a major part of the second contact structure, may contribute to homogenizing luminance in a light-transmitting light-emitting device.

In other words, a peripheral anode contact, which is surrounded by a peripheral cathode contact in such a way that a major part of or the entire anode contact is laterally surrounded by the cathode contact, leads, for example, to a marked improvement in luminance homogeneity.

According to at least one embodiment of the light-emitting device, the first electrode and/or the second electrode is reflective at least in places. "Reflective" means here and hereinafter, for example, that at least 50%, in particular at least 75% and preferably at least 85% of visible light impinging on a reflective location is reflected by the reflective element. It is thus possible for at least one of the light-emitting faces or all the light-emitting faces to be reflective. The device may then be a "top emitter" or a "bottom emitter". In particular, it is possible for the device to comprise light-transmitting and reflective light-emitting faces.

It has surprisingly been identified that, inter alia, the arrangement of a second contact structure, which laterally surrounds a major part of the at least one light-emitting face, and optionally the arrangement of a first contact structure, which laterally surrounds a major part of the at least one light-emitting face and/or a major part of the second contact structure, may also contribute to homogenizing luminance in the case of a device which comprises at least one reflective electrode actually distinguished by good transverse conductivity. In particular, however, in devices with large light-emitting faces or devices with a plurality of light-emitting faces, the arrangement of peripheral contact structures has proven particularly advantageous for homogenizing luminance.

According to at least one embodiment of the light-emitting device, the light-emitting device comprises at least two light-emitting faces which are arranged laterally adjacent one another. In the present case, it is also possible for the light-emitting device to comprise three or more light-emitting faces which are arranged laterally adjacent one another. In other words, the light-emitting faces are isolated from one another in lateral directions and the light-emitting device comprises more than one light-emitting face. At least one or each of the light-emitting faces may in this case output light in two opposite spatial directions, such that the entirety of all the light-emitting faces of the light-emitting device emits bilaterally.

The entirety of the light-emitting faces is in this case the sum of all the light-emitting faces of the light-emitting device arranged adjacent one another.

According to at least one embodiment of the light-emitting device, the first contact structure laterally surrounds a major part of the entirety of the at least two light-emitting faces and the second contact structure laterally surrounds a major part of the entirety of the at least two light-emitting faces. In other words, the two contact structures do not individually surround the individual light-emitting faces of the light-emitting device, but rather the sum of the light-emitting faces, i.e., the entirety thereof, is in each case laterally surrounded by the contact structures. If the entirety of the light-emitting faces of the light-emitting device, for example, forms a circular or a rectangular area, the first and second contact structures laterally surround this circular or rectangular area. The individual light-emitting faces of the light-emitting device may have any desired shape.

According to at least one embodiment of the light-emitting device, an active layer stack which is separately operable from the active layer stacks of another light-emitting face is assigned to each of the at least one light-emitting faces. The light-emitting faces extend, for example, parallel to the major faces of the assigned active layer stack. One layer stack may be unambiguously assigned to each of the light-emitting faces. The layer stacks themselves are then arranged laterally adjacent one another and may, for example, be arranged on a common carrier, which may be formed with a glass sheet or a film.

The individual active layer stacks of the light-emitting faces are in this case operable separately from one another. This is achieved, for example, in that at least one of the two electrodes is isolated from one another, such that, for example, the second electrode comprises sub-regions which are electrically insulated from one another, wherein each sub-region is assigned on a one-to-one basis to an active layer stack.

The individual active layer stacks of the light-emitting device are here spaced from one another by a distance, for example, of at least 5 µm and at most 1 mm, in particular of at least 20 µm and at most 100 µm. In other words, the individual active layer stack and thus the individual light-emitting faces of the light-emitting device are spaced from one another in lateral directions. In this way, it is possible for the subdivision of the light-emitting face of the light-emitting device into a plurality of light-emitting faces, for example, not to be discernible by a human observer when the device is switched off.

The active layer stacks may here be of identical or mutually different construction, such that, within the bounds of manufacturing tolerances, they may generate light of the same color location or light of different color locations. In other words, it is possible for segmentation of the light-emitting face of the light-emitting device into at least two light-emitting faces to be discernible during operation in that the light-emitting faces are operated separately from one another or light of a different light characteristic curve exits from different light-emitting faces.

Overall, the light-emitting device may therefore be a segmented, transparent OLED, which is light-transmitting at least in places and which comprises a plurality of light-emitting faces which are laterally adjacent, for example, in plan view.

According to at least one embodiment of the light-emitting device, the first contact structure comprises at least one first contact, at which the first contact structure is contactable, wherein a first feed region, from which current is injected via the first contact structure into the at least one active layer stack, is arranged at a distance from the at least one first contact.

The feed regions are in this case those regions of a contact structure from which more current enters the assigned electrode and thus the active layer stack than from adjacent regions of the contact structure, and/or at which a higher voltage is applied than at adjacent regions of the contact structure. In other words, the current intensity of the current injected from the contact structure into the adjacent electrode and/or the voltage applied in the feed region has at least one local maximum.

According to at least one embodiment of the light-emitting device, the first contact structure comprises an isolating structure which extends from one of the at least one first contacts to the first feed region. The isolating structure may, for example, be a recess in the first contact structure, in the region of which the first contact structure has been completely or partially removed. Such a recess may, for example, be produced by means of a laser or a lithographic method. The metallization, which may form the first contact structure, is, for example, completely removed, thinned or partially cut through in the region of the isolating structure. The isolating structure may reduce or prevent direct injection of current into the assigned electrode of the first contact structure as far as the feed point.

According to at least one embodiment of the light-emitting device, the second contact structure comprises at least one second contact, at which the second contact structure is contactable, wherein a second feed region, from which current is injected via the second contact structure into the at least one active layer stack, is arranged at a distance from at least one second contact.

According to at least one embodiment of the light-emitting device, the second contact structure comprises an isolating structure which extends from one of the at least one second contacts to the second feed region. The isolating structure may, for example, be a recess in the second contact structure, in the region of which the second contact structure has been completely or partially removed. Such a recess may, for example, be produced by means of a laser or a lithographic method. The isolating structure may be of elongate configuration. In addition, the isolating structure may extend in the vertical direction completely through the material of the second contact structure. For example, the metallization, which may form the second contact structure, has been completely removed in the region of the isolating structure. In other words, the isolating structure may be a hole, in particular of elongate configuration, in the material of the second contact structure. The isolating structure may reduce or prevent direct injection of current into the assigned electrode of the second contact structure as far as the feed point.

In a light-emitting device described here, current injection does not therefore mainly or only mainly take place in the region of the contact, but rather it is displaced or shifted to other locations of the contact structure in order to achieve maximally uniform current feed to the electrode assigned to the contact structure and thus to the at least one active layer stack. This may increase the homogeneity of the luminance of the light emitted at the at least one light-emitting face. In particular, a charge carrier path within the second contact structure may be extended by means of the isolating structure, and thus a voltage drop may be made homogeneous along the layer stack, as a result of a broadening or enlarging of the feed region along the layer stack.

The at least one active layer stack may in particular comprise light-generating layers which are formed with an organic semiconductor material. For such a semiconductor material, conductivity rises as temperature rises. This results in elevated luminance at the hottest points of the at least one light-emitting face. In the case in particular of light-transmitting light-emitting devices which do not have a readily thermally conductive reflective electrode, luminance distribution is therefore dominated by the distribution of heat over the light-emitting face. The hottest point of the light-emitting face is in this case located, for example, in the middle of the light-emitting face.

The light-emitting device described here is based inter alia on the consideration that homogenization of the luminance profile may be achieved by shifting the feed regions into regions of the light-emitting device where less heat is to be expected.

It is furthermore assumed that the voltage decreases in a linear manner from the feed point, i.e., from feed regions, for the anode and increases in a linear manner for the cathode, if the cathode is at a potential of 0 volt and the conductivity of the anode and the cathode is roughly equal, it thereby proving optimal for homogenizing luminance for the first feed regions and the second feed regions to be maximally spaced apart, wherein, in the case of more than one first feed region, the first feed regions are also maximally spaced apart and, in the case of more than one second feed region, the second feed regions are also maximally spaced apart. If the light-emitting device comprises, for example, two first feed regions and two second feed regions, it has proven optimum for the feed regions to be arranged equidistantly from one another in the sequence first first feed region, first second feed region, second first feed region and second second feed region along an envelope curve of the at least one light-emitting face.

According to at least one embodiment of the light-emitting device, the light-emitting device comprises at least two first feed regions arranged in such a way that they are maximally spaced apart along the first contact structure.

According to at least one embodiment of the light-emitting device, the light-emitting device comprises at least two second feed regions arranged in such a way that they are maximally spaced apart along the second contact structure.

According to at least one embodiment of the light-emitting device, the first electrode and the second electrode are two-dimensional and light-transmitting, wherein the first electrode and the second electrode are free of busbars. It has been found that the use of contact structures which surround a major part of the light-emitting face, and/or the use of feed regions which are arranged at a distance from contacts of the contact structure, allow(s) such good homogenization of the luminance profile that it is possible to dispense, for example, with metallic current distribution tracks on the electrodes, which may, for example, increase the transverse conductivity of the electrodes. The transparent appearance of the light-emitting faces is therefore particularly marked for a light-emitting device described here, since there is no absorption by busbars.

BRIEF DESCRIPTION OF THE DRAWINGS

The light-emitting device described here is explained in greater detail below with reference to exemplary embodiments and the associated figures.

FIGS. 1, 2, 3, 4A, 4B and 5A show schematic plan views onto exemplary embodiments of light-emitting devices described here.

FIG. 5B is a schematic sectional representation of the first exemplary embodiment of a light-emitting device described here.

FIGS. 6A and 6B each show a schematic sectional representation of an exemplary embodiment of a light-emitting device described here.

Figure 1:
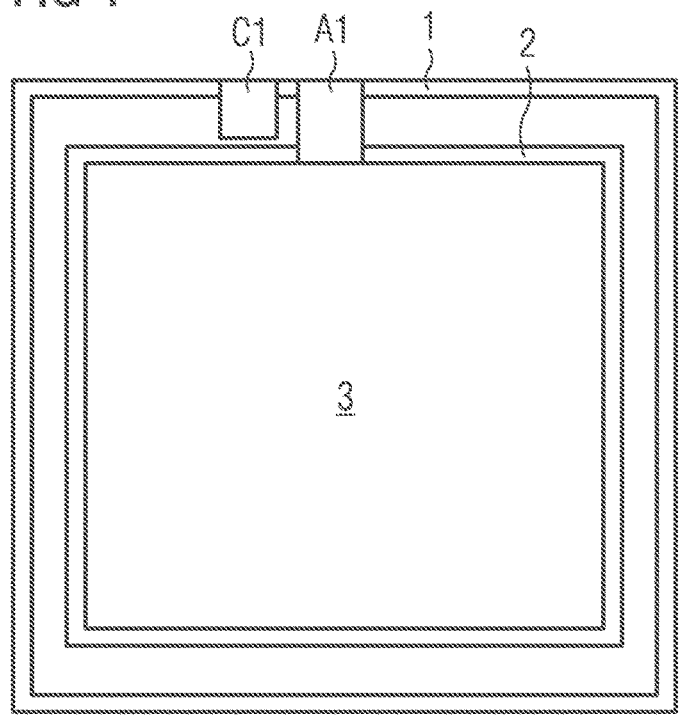

Identical, similar or identically acting elements are provided with identical reference numerals in the figures. The figures and the size ratios of the elements illustrated in the figures relative to one another are not to be regarded as being to scale. Rather, individual elements may be illustrated on an exaggeratedly large scale for greater ease of depiction and/or better comprehension.

FIG. 1 shows a schematic plan view of a light-emitting device described here. In the exemplary embodiment of FIG. 1, the light-emitting device comprises precisely one light-emitting face 3. When the light-emitting device is in operation, light 6 is emitted from the light-emitting face 3. In particular, light 6 is emitted bilaterally, out of the plane of the drawing and into the plane of the drawing. The light-emitting device, for example, comprises a light-transmitting light-emitting device, which is light-transmitting, in particular clear and transparent, in the region of the light-emitting face 3. It is moreover possible for at least one of the electrodes 10, 20 to be reflective at least in places.

The light-emitting device comprises an active layer stack 30, which, for example, comprises layers of organic semiconductor material and which is configured to generate the light exiting from the light-emitting face.

The active layer stack 30 is shown, for example, in the sectional representation of FIG. 5B. At the bottom thereof, the active layer stack 30 adjoins the second electrode 20, and at the top thereof, the active layer stack 30 adjoins the first electrode 10. In the region of the light-emitting face 3, the first electrode 10 and the second electrode 20 are light-transmitting. The first electrode 10 is, for example, a cathode formed by a thin, light-transmitting metal layer. The first electrode 10 may in this case be formed with metals such as silver and/or magnesium.

The second electrode 20, for example, comprises an anode of the light-emitting device, which is formed, for example, with a transparent conductive oxide such as ITO.

It is moreover possible for at least one of the electrodes 10, 20 to be reflective at least in places.

The active layer stack 30 comprises organic layers for emitting light and for feeding charge carriers.

In the exemplary embodiment of FIG. 1, the light-emitting face 3 is completely laterally enclosed by the second contact structure 2. The light-emitting face 3 is furthermore completely laterally surrounded by the first contact structure 1, which also completely laterally surrounds the second contact structure 2. The contact structures 1, 2 are here formed with metallizations which may, for example, be formed with alloys such as CrAlCr or MAM (see also in this respect the sectional representation of FIG. 5B). The second electrode 20 here comprises an isolation 5, for example, a cut which suppresses a short circuit between the first electrode 10 and the second electrode 20. The first electrode 10 here completely encases the light-emitting component on the top thereof remote from the second electrode 20, this not being apparent from the sectional representation of FIG. 5B, such that the first electrode 10 may be contacted via the first contact structure 1.

The isolation 5, for example, in the second electrode 20, is here, for example, produced by a laser beam or a lithographic method.

In order to insulate the second contact structure 2 from the first electrode 10, insulation 4, for example, in the form of an insulating material such as polyimide (PI), is arranged between the second contact structure 2 and the first electrode 10.

In the exemplary embodiment of FIG. 1, current injection may proceed directly at contacts C1, A1, wherein the first contact C1 serves for contacting the first contact structure 1 and the second contact A1 for contacting the second contact structure 2.

Figure 2:
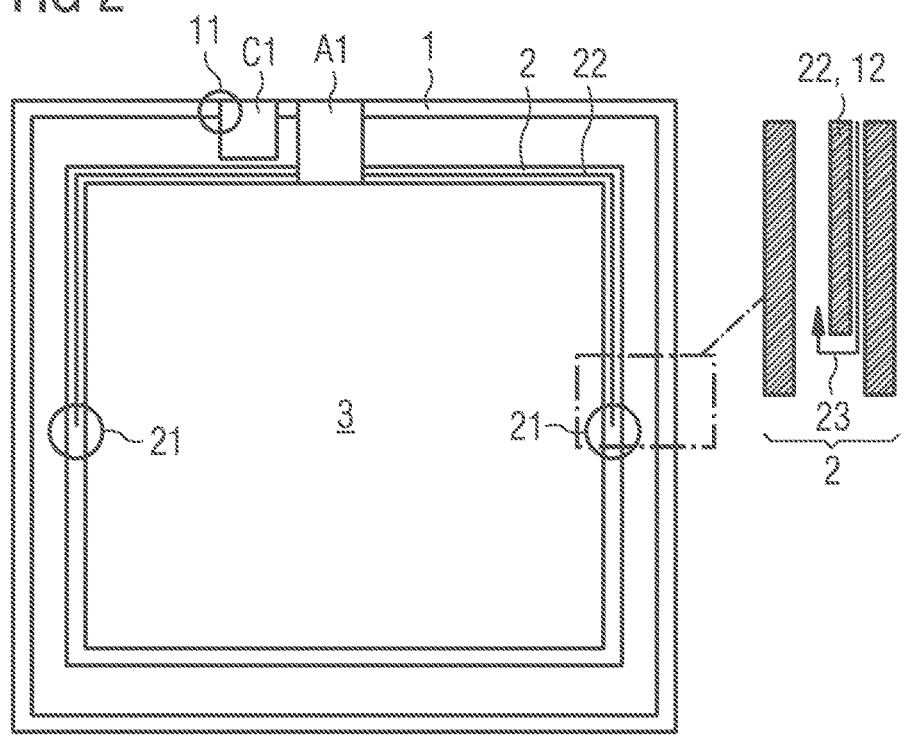

In contrast thereto, the light-emitting component according to the exemplary embodiment of FIG. 2 comprises two second feed points 21 for current from the second contact structure 2. To this end, the second contact structure 2 comprises an isolating structure 22, for example, in the form of a recess which extends on both sides of the light-emitting face 3 from the second contact A1 to the second feed region 21.

The isolating structure 22, for example, takes the form of a recess in the material of the second contact structure 2. The magnified representation of FIG. 2 shows the current path 23 for current from the second contact A1, from which it is apparent that it is only from the second feed region 21 that current is injected into the second electrode 20 and thus into the active layer stack 30.

The schematic plan view of FIG. 3 shows for a further exemplary embodiment of the light-emitting device described here that the first contact structure 1 may also comprise two first feed regions 11 which are produced, for example, by corresponding isolating structures 12 in the first contact structure 1 (not shown in FIG. 3). The first feed regions 11 and second feed regions 21 are here preferably in each case arranged maximally far apart, so resulting, for example, in the arrangement of the feed regions 11, 21 shown in FIG. 3.

FIG. 4A shows a further exemplary embodiment which, unlike the exemplary embodiment of FIG. 3, comprises a light-emitting device described here in an embodiment with two light-emitting faces 31, 32 which add up in their entirety to the light-emitting face 3. The two light-emitting faces each, for example, comprise separately operable active layer stacks 30. They are isolated from one another by the segmentation 33. The segmentation 33 may, for example, be achieved by a separate second electrode 20 which is split, for example, by means of a laser beam or lithographically, wherein the segmentation 33 extends through the second electrode and the second contact structure 2. The first electrode 10 may, for example, be common to all the light-emitting faces 31, 32. The different light-emitting faces 31, 32 are then driven separately via the second electrode 20. The segmentation 33 here also extends through the second contact structure 2 in order to allow the light-emitting faces 31, 32 to be driven separately. The light-emitting device comprises two first contacts C1, C2 for contacting the first contact structure 1 and two second contacts A1, A2 for contacting the second contact structure 2. Overall, it is possible for the first electrode 10 and/or the second electrode 20 to be cut through in such light-emitting devices with two or more light-emitting faces.

It is possible for all the light-emitting faces 31, 32 of the device to be light-transmitting. It is furthermore possible for all the light-emitting faces 31, 32 to comprise a reflective electrode 10, 20, such that light is emitted in just one direction, wherein different light-emitting faces may also emit light in mutually differing directions. It is furthermore possible for at least one of the light-emitting faces to be light-transmitting and at least one of the light-emitting faces to be unilaterally emitting and, to this end, to comprise a reflective electrode.

In the exemplary embodiment of FIG. 4B, unlike in the exemplary embodiment of FIG. 4A, contacts A1, A2 of the second contact structure 2 are not guided to the periphery of the device, but are instead located directly on the second contact structure 2. With such an arrangement, it is particularly simple to provide a device in which both contact structures 1, 2 take the form of a continuous frame and thus each completely surround the light-emitting faces 31, 32. Such an arrangement of the contact structures and the associated contacts is possible for all the exemplary embodiments described here.

A further exemplary embodiment of a light-emitting device described here is illustrated in greater detail in conjunction with FIG. 5A. In this exemplary embodiment, the first contact structure 1 and the second contact structure 2 do not completely enclose the segmented light-emitting face 3, which comprises a first light-emitting face 31 and a second light-emitting face 32, but are instead merely arranged on the longer side faces of the rectangular light-emitting face 3. The first contact structure 1 and the second contact structure thus laterally surround a major part of the light-emitting face 3, namely over more than 50% of the length thereof. The first contact structure 1 furthermore completely laterally surrounds the second contact structure.

FIG. 5B shows a schematic sectional representation of the right-hand side of the light-emitting device shown in FIG. 5A with the first light-emitting face 31 and the contact structures 1, 2.

FIGS. 6A and 6B each show a schematic sectional representation of the right-hand side of the light-emitting device shown in FIG. 5A. Alternative and/or complementary options for laterally contacting the light-emitting device in comparison with FIG. 5B are shown here.

The light-emitting device of FIG. 6A is of a structure which is similar or identical to that of the light-emitting device of FIG. 5B. The first contact structure 1, the second contact structure 2, the insulation 4, the active layer stack 30 and the first electrode 10 are applied on the second electrode 20. A substrate (not shown in the figures), for example, a glass sheet or a film, may additionally be applied on a side of the second electrode 20 remote from the active layer stack 30. The first contact structure 1 and the second contact structure 2 may be formed with the same material. The first contact structure 1 and the second contact structure 2 may be spatially isolated from one another in lateral directions.

The second electrode 20 and the second contact structure 2 comprise the isolation 5 which may extend in the vertical direction completely through the second electrode 20 and the second contact structure 2. It is possible by means of the isolation 5 to insulate the left-hand side and the right-hand side, hereinafter also inner and outer side, of the second electrode 20 and/or of the second contact structure 2, electrically from one another.

The active layer stack 30 and the first electrode 10 are of contiguous construction. The active layer stack 30 extends, starting from the first light-emitting face 31, in lateral directions to the insulation 4. Side faces extending in the vertical direction of the second contact structure 2 and the insulation 4 may then be encased in places by the active layer stack 30. The first electrode 10 furthermore extends, starting from the first light-emitting face 31, over the active layer stack 30 and the isolation 5 as far as the first contact structure 1. The first electrode 10 may be in direct contact with the first contact structure 1. The side of the first contact structure 1 remote from the second contact structure 20 may in places be free of the first electrode 10. At these places, the first contact structure 1 may be freely accessible and be externally electrically contactable.

In FIG. 6B, the second electrode 20 comprises a plurality of isolations 5. The isolations 5 extend through the second contact structure 2 and the first contact structure 1. The side of the insulation 4 remote from the second electrode 20 may be completely covered by the active layer stack 30.

The dimensions of the components shown in FIGS. 6A and 6B may, for example, be as follows. A width of the isolation 5 may be at least 55 µm and at most 65 µm, in particular 60 µm. The inner region of the second contact structure 2, i.e., the region of the second contact structure 2 which adjoins the organic layer stack 30, may, for example, have a width of at least 350 µm and at most 450 µm, in particular 400 µm. The insulation 4 may furthermore have a width of at least 1.1 mm and at most 1.5 mm, in particular 1.3 mm.

Thanks to the described embodiment of the contact structures 1, 2 and the described selection of the first feed regions 11 and second feed regions 21, it is possible to provide a segmented organic light-emitting diode, which is, for example, transparent at least in places and is distinguished by a particularly homogeneous luminance profile on the light-emitting faces 31, 32, 3 thereof. Due to these measures, it is, for example, possible to reduce the difference between the maximum temperature on the light-emitting face and the minimum temperature on the light-emitting face to below 15° C. Furthermore, the potential difference between the highest voltage applied to the least one active layer stack 30 and the lowest voltage applied to the at least one active layer stack 30 may be reduced to less than 1 volt, in particular less than 0.1 volt. In particular because it is possible to arrange the feed regions for the first electrode 10 and the second electrode 20 maximally far apart, it is possible to compensate for the fact that the light-emitting face 3 becomes hottest in the middle thereof, since the voltage and thus the current are particularly high at the feed regions, i.e., in each case maximally far away from the middle of the light-emitting face.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. A light-emitting device comprising:
   at least one active layer stack configured to generate light;
   a first electrode electrically contacting the at least one active layer stack;
   a second electrode electrically contacting the at least one active layer stack;
   at least one light-emitting face for emitting light;
   a first contact structure electrically conductively connected to the first electrode; and
   a second contact structure electrically conductively connected to the second electrode, wherein the first contact structure laterally surrounds a major part of the at least one light-emitting face and a major part of the second contact structure,
   wherein the second contact structure laterally surrounds a major part of the at least one light-emitting face,
   wherein the first contact structure comprises at least one first contact at which the first contact structure is contactable and a first feed region, from which current is injectable via the first contact structure into the at least one active layer stack, wherein the first feed region is arranged at a distance from the at least one first contact, and
   wherein the first contact structure comprises an isolating structure extending from one of the at least one first contacts to the first feed region.

2. The light-emitting device according to claim 1, wherein the light-emitting device is light-transmitting in a region of at least one of the at least one light-emitting faces.

3. The light-emitting device according to claim 1, wherein the first electrode and/or the second electrode is/are reflective at least in places.

4. The light-emitting device according to claim 1, wherein the at least one light-emitting face comprises at least two light-emitting faces are arranged laterally adjacent one another, wherein the first contact structure laterally surrounds a major part of an entirety of the at least two light-emitting faces, and wherein the second contact structure laterally surrounds a major part of the entirety of the at least two light-emitting faces.

5. The light-emitting device according to claim 4, wherein a first active layer stack is assigned to a first light-emitting face and separately operable from second active layer stacks assigned to other light-emitting faces.

6. The light-emitting device according to claim 1, wherein the second contact structure comprises at least one second contact, at which the second contact structure is contactable and a second feed region, from which current is injected via the second contact structure into the at least one active layer stack, and wherein the second feed region is arranged at a distance from the at least one second contact.

7. The light-emitting device according to claim 6, wherein the second contact structure comprises an isolating structure extending from one of the at least one second contacts to the second feed region.

8. The light-emitting device according to claim 1, further comprising at least two first feed regions which are arranged such that they are maximally spaced apart along the first contact structure.

9. The light-emitting device according to claim 8, further comprising at least two second feed regions which are arranged such that they are maximally spaced apart along the second contact structure.

10. The light-emitting device according to claim 1, wherein the first electrode and the second electrode are two-dimensional and light-transmitting, and wherein the first electrode and the second electrode are free of busbars.

11. A light-emitting device comprising:
    active layer stacks configured to generate light;
    a first electrode electrically contacting the active layer stacks;
    a second electrode electrically contacting the active layer stacks;
    light-emitting faces for emitting light;
    a first contact structure electrically conductively connected to the first electrode; and
    a second contact structure electrically conductively connected to the second electrode, wherein the first contact structure laterally surrounds a major part of all light-emitting faces and a major part of the second contact structure, wherein the second contact structure laterally surrounds a major part of all light-emitting faces, wherein each active layer stack is assigned to one of the light-emitting faces, and wherein active layer stacks assigned to different light-emitting faces are separately operable from each other.

12. The light-emitting device according to claim 11, wherein the active layer stacks assigned to the light-emitting faces are arranged laterally adjacent one another.

13. The light-emitting device according to claim 11, wherein the first electrode and/or the second electrode is/are reflective at least in places.

14. The light-emitting device according to claim 11, wherein the first contact structure laterally surrounds an entirety of the light-emitting faces, and wherein the second contact structure laterally surrounds a major part of the entirety of the light-emitting faces.

15. The light-emitting device according to claim 11, wherein a first active layer stack is assigned to a first light-emitting face and is separately operable from second active layer stacks assigned to other light-emitting faces.

16. The light-emitting device according to claim 11, wherein the first contact structure comprises at least one first contact at which the first contact structure is contactable and a first feed region, from which current is injected via the first contact structure into the at least one active layer stack, and wherein the first feed region is arranged at a distance from the at least one first contact.

17. The light-emitting device according to claim 16, wherein the first contact structure comprises an isolating structure extending from one of the at least one first contacts to the first feed region.

18. The light-emitting device according to claim 11, wherein the second contact structure comprises at least one second contact, at which the second contact structure is contactable and a second feed region, from which current is injected via the second contact structure into the at least one active layer stack, and wherein the second feed region is arranged at a distance from the at least one second contact.

19. The light-emitting device according to claim 18, wherein the second contact structure comprises an isolating structure extending from one of the at least one second contacts to the second feed region.

20. The light-emitting device according to claim 11, further comprising at least two first feed regions which are arranged such that they are maximally spaced apart along the first contact structure.

21. The light-emitting device according to claim 20, further comprising at least two second feed regions which are arranged such that they are maximally spaced apart along the second contact structure.

22. The light-emitting device according to claim 11, wherein the first electrode and the second electrode are two-dimensional and light-transmitting, and wherein the first electrode and the second electrode are free of busbars.

* * * * *